United States Patent
Kim et al.

(10) Patent No.: US 10,038,163 B2
(45) Date of Patent: Jul. 31, 2018

(54) DISPLAY DEVICE

(71) Applicant: SAMSUNG DISPLAY CO., LTD., Yongin-si, Gyeonggi-do (KR)

(72) Inventors: Gunmo Kim, Yongin-si (KR); Wonsang Park, Yongin-si (KR); Wonil Choi, Yongin-si (KR); Jongho Hong, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/297,193

(22) Filed: Oct. 19, 2016

(65) Prior Publication Data

US 2017/0288168 A1    Oct. 5, 2017

(30) Foreign Application Priority Data

Mar. 29, 2016    (KR) .................. 10-2016-0037875

(51) Int. Cl.
*H01L 51/52*    (2006.01)
*H01L 27/32*    (2006.01)
*H01L 51/00*    (2006.01)

(52) U.S. Cl.
CPC ...... *H01L 51/5253* (2013.01); *H01L 27/3258* (2013.01); *H01L 27/3276* (2013.01); *H01L 51/0097* (2013.01)

(58) Field of Classification Search
CPC . H01L 51/52; H01L 51/5253; H01L 51/0097; H01L 51/5237; H01L 27/3276
See application file for complete search history.

(56) References Cited

U.S. PATENT DOCUMENTS

| | | |
|---|---|---|
| 7,621,794 B2 | 11/2009 | Lee et al. |
| 9,252,395 B2 | 2/2016 | Oh |
| 2003/0064171 A1 | 4/2003 | Burrows et al. |
| 2003/0203210 A1 | 10/2003 | Graff et al. |
| 2009/0208754 A1 | 8/2009 | Chu et al. |
| 2012/0098026 A1 | 4/2012 | Kwack et al. |
| 2014/0028686 A1 | 1/2014 | He et al. |
| 2014/0159002 A1* | 6/2014 | Lee ............... H01L 27/3246 257/40 |
| 2016/0005999 A1 | 1/2016 | Lee et al. |
| 2016/0093827 A1* | 3/2016 | Han ............... H01L 51/5246 257/40 |

(Continued)

FOREIGN PATENT DOCUMENTS

| | | |
|---|---|---|
| KR | 10-2015-0071642 A | 6/2015 |
| KR | 10-2015-0135721 A | 12/2015 |

*Primary Examiner* — Phuc Dang
(74) *Attorney, Agent, or Firm* — Lee & Morse P.C.

(57) ABSTRACT

A display apparatus including a substrate; a plurality of unit displays disposed over the substrate, each of the unit displays including a thin film transistor including at least one inorganic layer, a display device electrically connected to the thin film transistor, and a planarization layer between the thin film transistor and the display device; and an encapsulation layer encapsulating the plurality of unit displays, wherein the planarization layer of each of the unit displays includes a spaced area exposing a surface of the at least one inorganic layer between the plurality of unit displays, and wherein the encapsulation layer contacts the at least one inorganic layer in the spaced area.

18 Claims, 9 Drawing Sheets

(56) References Cited

U.S. PATENT DOCUMENTS

| | | | |
|---|---|---|---|
| 2016/0118451 A1* | 4/2016 | Youn | H01L 27/3262 257/40 |
| 2016/0133874 A1* | 5/2016 | Kim | H01L 51/5259 257/40 |
| 2016/0149155 A1* | 5/2016 | Kim | H01L 51/5228 257/40 |

* cited by examiner

DISPLAY DEVICE

CROSS-REFERENCE TO RELATED APPLICATION

Korean Patent Application No. 10-2016-0037875, filed on Mar. 29, 2016, in the Korean Intellectual Property Office, and entitled: "Display Device," is incorporated by reference herein in its entirety.

BACKGROUND

1. Field

Embodiments relate to a display apparatus.

2. Description of the Related Art

As the display field visually expressing various types of electric signal information develops rapidly, various flat panel display devices having excellent characteristics such as a slim profile, a light weight, and low power consumption have been considered. Recently, along with the development of display-related technology, flexible display devices that are foldable or rollable have been developed. Furthermore, research into and development of stretchable display devices that are able to be changed to various shapes are being actively conducted.

SUMMARY

Embodiments are directed to a display apparatus.

The embodiments may be realized by providing a display apparatus including a substrate; a plurality of unit displays disposed over the substrate, each of the unit displays including a thin film transistor including at least one inorganic layer, a display device electrically connected to the thin film transistor, and a planarization layer between the thin film transistor and the display device; and an encapsulation layer encapsulating the plurality of unit displays, wherein the planarization layer of each of the unit displays includes a spaced area exposing a surface of the at least one inorganic layer between the plurality of unit displays, and wherein the encapsulation layer contacts the at least one inorganic layer in the spaced area.

The spaced area may surround each of the plurality of unit displays.

The planarization layer of each of the unit displays may include unit planarization areas respectively corresponding to the plurality of unit displays, and the unit planarization areas may be spaced apart from each other by the spaced area.

The planarization layer may include an organic material.

The encapsulation layer may include at least one inorganic encapsulation layer, and the at least one inorganic encapsulation layer may contact the at least one inorganic layer in the spaced area.

The encapsulation layer may include at least one organic encapsulation layer, the at least one inorganic encapsulation layer may include a first inorganic encapsulation layer below the at least one organic encapsulation layer and a second inorganic encapsulation layer above the at least one organic encapsulation layer, and the first inorganic encapsulation layer may contact the at least one inorganic layer in the spaced area.

The at least one organic encapsulation layer may include unit organic encapsulation layers respectively corresponding to the plurality of unit displays, and the first inorganic encapsulation layer and the second inorganic encapsulation layer may contact each other at an edge of the unit organic encapsulation layers.

Each of the plurality of unit displays may include a dam unit at an edge of each of the plurality of unit displays, and the unit organic encapsulation layers may be disposed inside the dam unit.

The at least one inorganic layer may include a first insulating layer between an active layer of the thin film transistor and a gate electrode and a second insulating layer on the gate electrode, and the first insulating layer or the second insulating layer may be exposed in the spaced area.

Each of the plurality of unit displays may include a passivation layer on the planarization layer, and the substrate may have a stack structure of a first barrier layer and a first support layer, the first barrier layer being closer to the thin film transistor than the first support layer.

The passivation layer may include an inorganic material.

The substrate may include a plurality of islands spaced apart from each other, a plurality of connection units connecting the plurality of islands, and a plurality of through units passing through the substrate between the plurality of connection units, and the plurality of unit displays may be respectively disposed over the plurality of islands.

The spaced area may include the plurality of connection units and the plurality of islands, and the encapsulation layer may contact the at least one inorganic layer at an edge of the plurality of islands.

The encapsulation layer may include a plurality of encapsulation layers respectively disposed on the plurality of islands and independently sealing the plurality of unit displays.

The plurality of islands may be repeatedly disposed in a first direction and a second direction different from the first direction, four connection units may be respectively connected to the plurality of islands, and the four connection units connected to one of the plurality of islands may extend in different directions and are respectively connected to other four islands that surround the one island.

Two adjacent ones of the plurality of islands may be connected to one of the plurality of connection units, and side surfaces of the two adjacent islands connected to the one connection unit and a direction in which the one connection unit extends may meet at acute angles.

Each of the plurality of islands may have a rectangular shape, and corners of the rectangular shape may be directed in the first direction and the second direction.

The display device may include a first electrode, a second electrode, and an intermediate layer between the first electrode and the second electrode, the intermediate layer including an organic emission layer.

Each of the plurality of unit displays may include at least one display device emitting red light, at least one display device emitting blue light, and at least one display device emitting green light.

The embodiments may be realized by providing a display apparatus including a substrate; a plurality of unit displays on the substrate, each of the unit displays including a thin film transistor including at least one inorganic layer, a display device electrically connected to the thin film transistor, and a planarization layer between the thin film transistor and the display device; and an encapsulation layer encapsulating the plurality of unit displays, wherein the planarization layer of each of the unit displays is isolated from other planarization layers such that a spaced area is between the isolated planarization layers, the spaced area overlying a surface of the at least one inorganic layer, and wherein the encapsulation layer contacts the at least one inorganic layer in the spaced area.

The encapsulation layer may include at least one inorganic encapsulation layer, and the at least one inorganic encapsulation layer may contact the at least one inorganic layer in the spaced area.

The encapsulation layer may include at least one organic encapsulation layer, the at least one inorganic encapsulation layer may include a first inorganic encapsulation layer on one side of the at least one organic encapsulation layer and a second inorganic encapsulation layer on another side of the at least one organic encapsulation layer, and the first inorganic encapsulation layer may contact the at least one inorganic layer in the spaced area.

The planarization layer of each of the unit displays may include unit planarization areas respectively corresponding to the plurality of unit displays, and the unit planarization areas may be spaced apart from each other by the spaced area.

The substrate may have a stack structure of a first barrier layer and a first support layer, the first barrier layer being between the thin film transistor and the first support layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
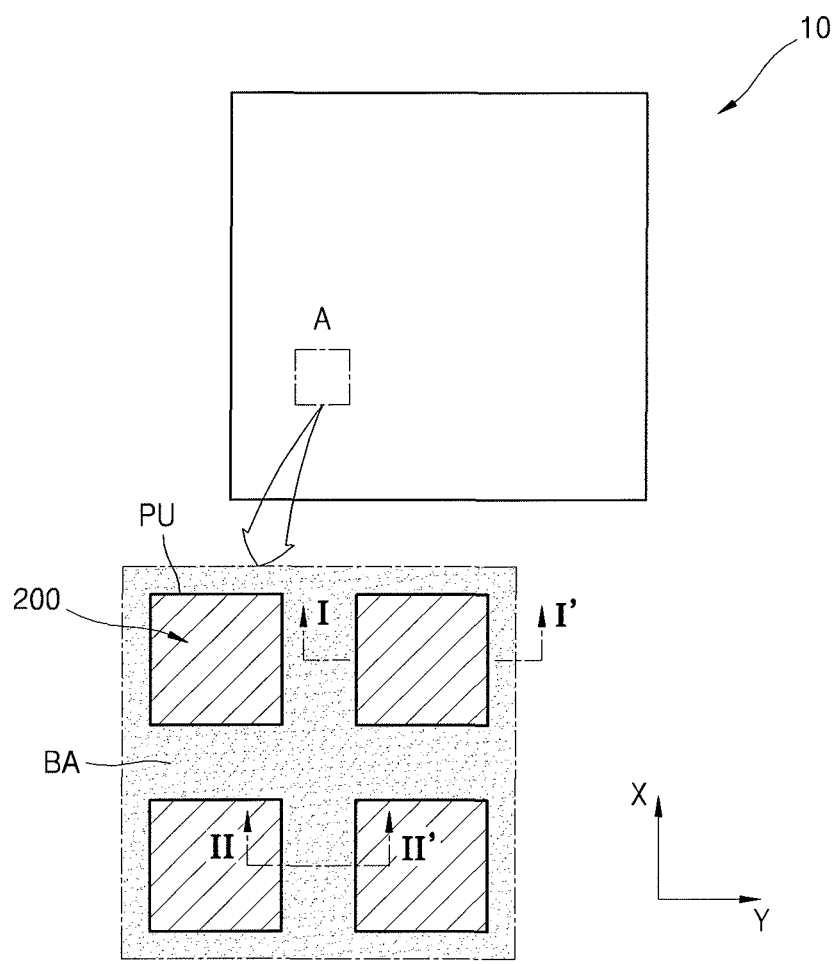
FIG. 1 illustrates a schematic plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when an element is referred to as being "between" two elements, it can be the only layer element the two elements, or one or more intervening elements may also be present. Like reference numerals refer to like elements throughout.

While such terms as "first", "second", etc., may be used to describe various components, such components must not be limited to the above terms. The above terms are used only to distinguish one component from another.

The terms used in the present specification are merely used to describe particular embodiments, and are not intended to limit the scope of the application. An expression used in the singular encompasses the expression in the plural, unless it has a clearly different meaning in the context.

It will be understood that when a layer, region, or component is referred to as being "formed on" or "formed under", another layer, region, or component, it can be directly or indirectly formed on or under the other layer, region, or component. For example, intervening layers, regions, or components can be present. The positions "on" and "under" may be determined on the basis of the drawings.

As used herein, the terms "or" and "and/or" includes any and all combinations of one or more of the associated listed items. Expressions such as "at least one of," when preceding a list of elements, modify the entire list of elements and do not modify the individual elements of the list.

Figure 2:
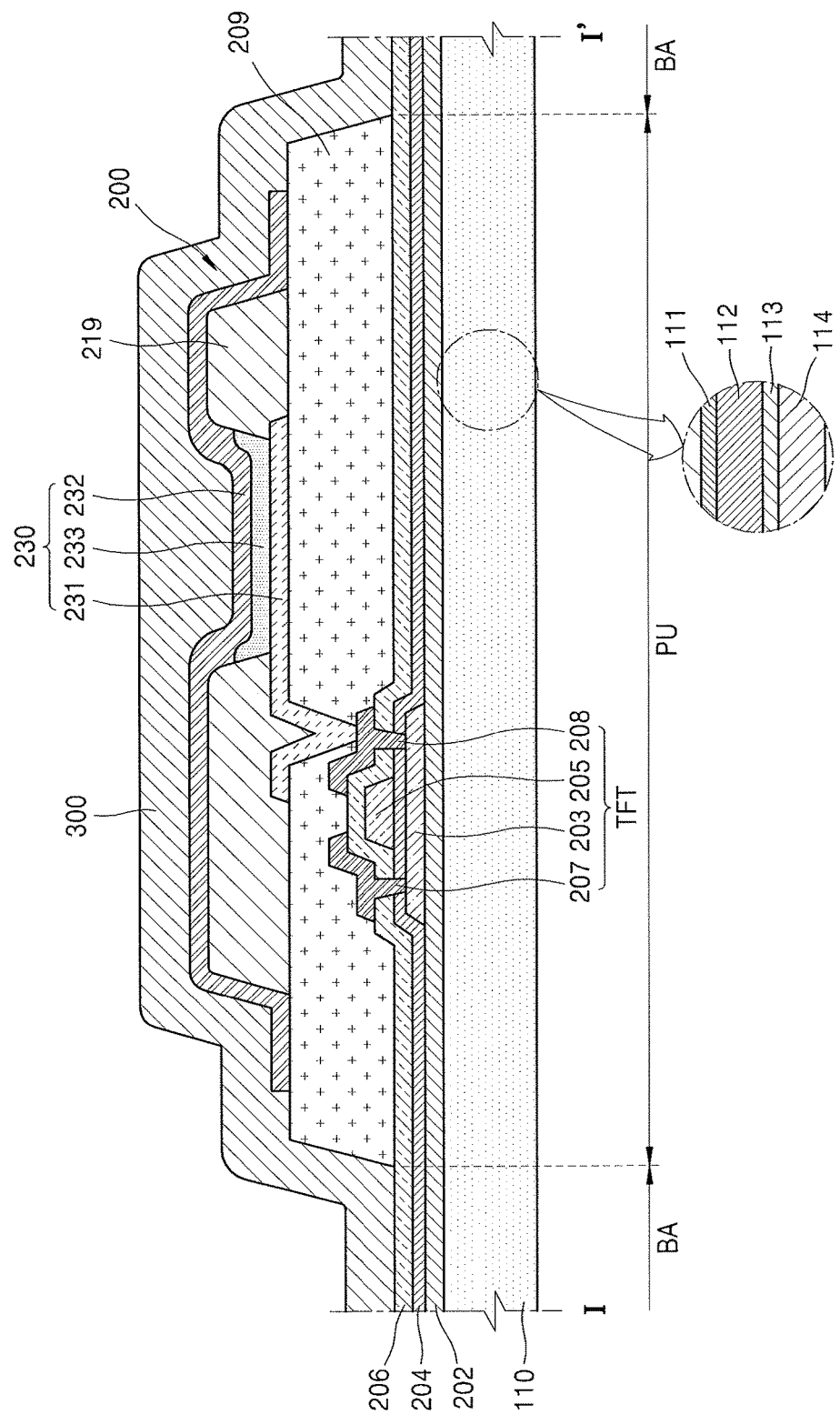
FIG. 2 illustrates a schematic cross-sectional view of an example of the display apparatus taken along line I-I' of FIG. 1.
Figure 3:
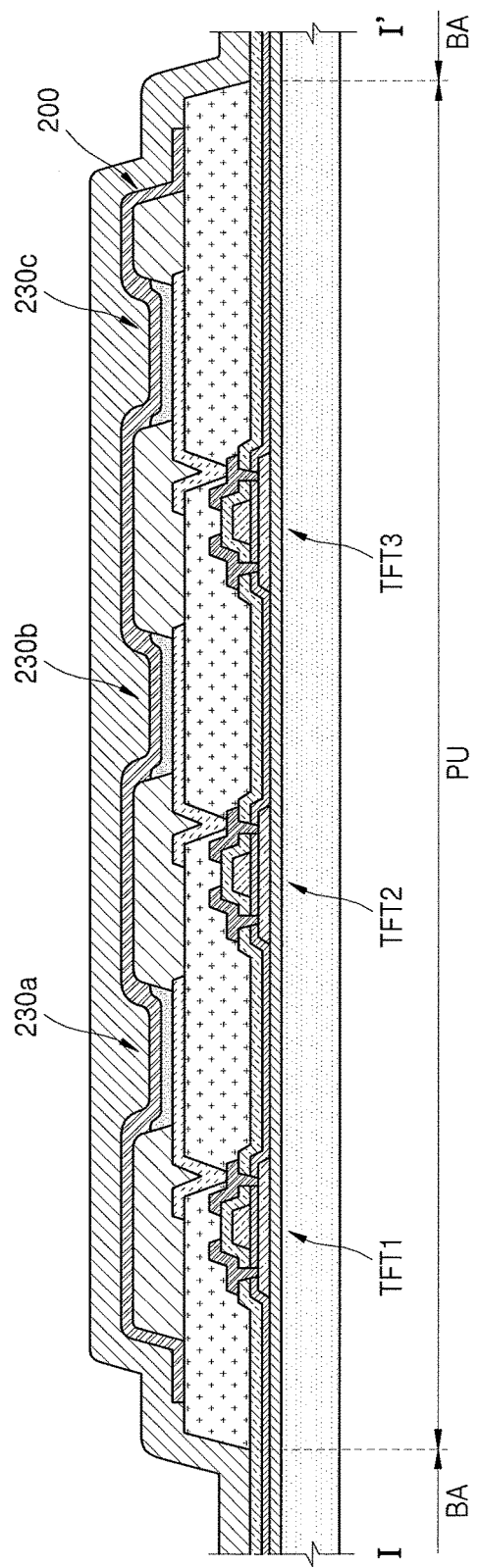
FIG. 3 illustrates a schematic cross-sectional view of another example of the display apparatus taken along line I-I' of FIG. 1.

FIG. 1 illustrates a schematic plan view of a display apparatus 10 according to an embodiment. FIG. 2 illustrates a schematic cross-sectional view of an example of the display apparatus 10 taken along line I-I' of FIG. 1. FIG. 3 illustrates a schematic cross-sectional view of another example of the display apparatus 10 taken along line I-I' of FIG. 1.

Referring to FIGS. 1 through 3, the display apparatus 10 according to an embodiment may include a substrate 110, a plurality of unit displays 200 over or on the substrate 110, and an encapsulation layer 300 over or on the substrate 110 and sealing the plurality of unit displays 200.

The substrate 110 may include various suitable materials. For example, the substrate 110 may include glass, metal, or an organic material.

In an implementation, the substrate 110 may include a flexible material. For example, the substrate 110 may include a material that may be bent, folded, or rolled. The flexible material forming the substrate 110 may include ultra-thin glass, metal, or plastic.

The substrate 110 may have a stack structure including, e.g., a first barrier layer 111, a first support layer 112, a second barrier layer 113, and a second support layer 114. In this regard, the first barrier layer 111, the first support layer 112, the second barrier layer 113, and the second support layer 114 may be sequentially stacked. In an implementation, the first barrier layer 111 may be disposed most adjacent or closest to a thin film transistor TFT formed over the substrate 110 (e.g., of the layers of the stacked structure substrate 110).

The first barrier layer 111 and the second barrier layer 113 may each independently include, e.g., an inorganic material. In an implementation, the first barrier layer 111 and the second barrier layer 113 may each independently include, e.g., silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The first support layer 112 and the second support layer 114 may each independently include an organic material. In an implementation, the first support layer 112 and the second support layer 114 may each independently include, e.g., polyimide (PI), polymethyl methacrylate (PMMA), polycarbonate (PC), polystyrene (PS), acryl-based resin, epoxy-based resin, polyethylene, or the like.

The first support layer 112 may be between the first barrier layer 111 and the second barrier layer 113 to help relax or reduce stress generated between the first barrier layer 111 and the second barrier layer 113.

The second support layer 114 may include, e.g., PI or the like. The display apparatus 10 may be formed over or on a base substrate such as a glass substrate and then may be separated from the base substrate via a process such as laser lift off LLO or the like. In this regard, the second support layer 114 may be used as a sacrificial layer for separating the base substrate from the display apparatus 10. Thus, a mark resulting from laser irradiation, etc. may remain on the second support layer 114.

As described above, the substrate 110 may have a stack structure including at least the first barrier layer 111, the first support layer 112, and the second barrier layer 113, thereby reducing and/or preventing external moisture and/or oxygen from penetrating into the display apparatus 10 through the substrate 110.

A plurality of unit displays 200 may be formed over or on the substrate 110. The plurality of unit displays 200 may be spaced apart from each other by a spaced area BA, e.g., with the spaced area BA therebetween. The plurality of unit displays 200 may be repeatedly disposed in a first direction X and a second direction Y different from the first direction X. For example, the first direction X and the second direction Y may meet at a right angle. In an implementation, the first direction X and the second direction Y may meet at an obtuse or acute angle.

Each of the plurality of unit displays 200 may include at least one display device and at least one TFT electrically connected to the at least one display device.

Each of the plurality of unit displays 200 may include at least one organic light-emitting device 230 emitting red, blue, green, or white light. For example, in the present embodiment, the organic light-emitting device 230 will be described as the display device. In an implementation, each of the unit displays 200 may include various types of display devices, such as a liquid crystal display.

For example, the unit display 200 may include one organic light-emitting device 230 emitting the red, blue, green, or white light, or may include a plurality of organic light-emitting devices 230 that emit the same color so that one unit display 200 forms one sub-pixel.

As another example, as shown in FIG. 3, the unit display 200 may include a plurality of organic light-emitting devices, e.g., first, second, and third organic light-emitting devices 230a, 230b, and 230c, that emit different light colors. For example, one unit display 200 may include the first organic light-emitting device 230a emitting the red (R) light, the second organic light-emitting device 230b emitting the green (G) light, and the third organic light-emitting device 230c emitting the blue (B) light to form a pixel. In this regard, the first organic light-emitting device 230a, the second organic light-emitting device 230b, and the third organic light-emitting device 230c may be electrically connected to a first thin film transistor TFT1, a second thin film transistor TFT2, and a third thin film transistor TFT3, respectively.

As another example, the unit display 200 may include a plurality of pixels. In this regard, the first, second, and third organic light-emitting devices 230a, 230b, and 230c included in the unit display 200 may be arranged in various configurations, such as an RGB configuration, a pentile configuration, or a honeycomb configuration, according to the efficiency of a material included in an organic emission layer.

A structure of the unit display 200 will be described in more detail below with reference to FIG. 2.

A buffer layer 202 may be formed on the substrate 110. In an implementation, the buffer layer 202 may include an inorganic material, e.g., silicon oxide, silicon nitride, silicon oxynitride, aluminum oxide, aluminum nitride, titanium oxide, titanium nitride, or the like, or an organic material, e.g., polyimide, polyester, or acryl, or the like, or stacks of these materials. The buffer layer 202 may be formed over or on an entire surface of the substrate 110.

A thin film transistor TFT may include an active layer 203, a gate electrode 205, a source electrode 207, and a drain electrode 208. A case where the thin film transistor TFT is of a top gate type in which the active layer 203, the gate electrode 205, the source electrode 207, and the drain electrode 208 are sequentially formed will now be described. In an implementation, various types of thin film transistors TFTs, such as a bottom gate type thin film transistor TFT, may be employed.

The active layer 203 may include a semiconductor material, e.g., amorphous silicon or polycrystalline silicon. In an implementation, the active layer 203 may include various other suitable materials. In an implementation, the active layer 203 may include an organic semiconductor material or the like. In an implementation, the active layer 203 may include an oxide semiconductor material. For example, the active layer 203 may include an oxide of a material selected from Group 12, 13, and 14 metal elements such as zinc (Zn), indium (In), gallium (Ga), tin (Sn), cadmium (Cd), and germanium (Ge)), or a combination thereof.

A first insulating layer 204 may be formed on the active layer 203. The first insulating layer 204 may have a multi-layer structure or a single layer structure including layers including an inorganic material such as silicon oxide and/or silicon nitride, or the like. The first insulating layer 204 may insulate the gate electrode 205 from the active layer 203. In an implementation, the first insulating layer 204 may be formed over both an island 101 and a connection unit 102 (see FIG. 7). The first insulating layer 204 may be formed over or on the entire surface of the substrate 110.

The gate electrode 205 may be formed above or on the first insulating layer 204 and may overlap with or overlie the active layer 203. The gate electrode 205 may be connected to a gate line that applies an ON/OFF signal to the thin film transistor TFT. The gate electrode 205 may include a low resistance metal material. In an implementation, the gate electrode 205 may include, e.g., aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), in a single layer structure or a multilayer structure.

A second insulating layer 206 may be formed on the gate electrode 205. The second insulating layer 206 may insulate the source electrode 207 and the drain electrode 208 and the gate electrode 205. The second insulating layer 206 may be formed over or on the entire surface of the substrate 110.

In an implementation, the second insulating layer 206 may have a multilayer structure or a single layer structure including layers including an inorganic material. For example, the inorganic material may be metal oxide or metal nitride. In an implementation, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

In an implementation, the second insulating layer 206 may have a multilayer structure or a single layer structure including layers including an organic material. The organic material may include, e.g., a polymer such as PMMA or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. In an implementation, the second insulating layer 206 may be a composite stack of inorganic insulating layers and organic insulating layers.

The source electrode 207 and the drain electrode 208 may be formed over the second insulating layer 206. Each of the source electrode 207 and the drain electrode 208 may include, e.g., aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), in a single layer structure or a multilayer structure. The source electrode 207 and the drain electrode 208 may contact an area of the active layer 203 via a contact hole that passes through the second insulating layer 206 and the first insulating layer 204.

A planarization layer 209 may be formed to cover the thin film transistor TFT. The planarization layer 209 may help resolve steps caused by the thin film transistor TFT and may planarize an upper surface, thereby reducing the likelihood and/or preventing a defect from occurring in the organic light-emitting device 230 as a result of unevenness of lower or interior elements thereof.

The planarization layer 209 may have a single layer structure or a multilayer structure including layers including an organic material. The organic material may include, e.g., a polymer such as PMMA or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 209 may be a composite stack of inorganic insulating layers and organic insulating layers.

The planarization layer 209 may be formed over the entire surface of the substrate 110. In an implementation, the planarization layer 209 may include unit planarization areas PU (respectively corresponding to the plurality of unit displays 200 via patterning), and the spaced area BA may be between the planarization areas PU such that an inorganic layer underlying the planarization layer 209 may be exposed. For example, the unit planarization area PU may define an area of the unit display 200.

The spaced area BA may be an area in which a part of the planarization layer 209 formed over the entire surface of the substrate 110 has been removed. The unit planarization areas PU may be spaced apart from each other by the spaced area BA, e.g., with the spaced area BA therebetween. For example, each of the plurality of unit planarization areas PU may be surrounded by the spaced area BA. In an implementation, the inorganic layer exposed by the spaced area BA may be one of the first insulating layer 204 and the second insulating layer 206.

The organic light-emitting device 230 may include a first electrode 231, a second electrode 232 facing the first electrode 231, and an intermediate layer 233 between the first electrode 231 and the second electrode 232.

The first electrode 231 may be electrically connected to the source electrode 207 or the drain electrode 208. The first electrode 231 may have various shapes. For example, the first electrode 231 may be patterned to have an island shape.

The first electrode 231 may be formed on the planarization layer 209, e.g., the unit planarization areas PU, and may be electrically connected to the thin film transistor TFT via a contact hole. The first electrode 231 may be, e.g., a reflective electrode. In an implementation, the first electrode 231 may include a reflective layer including, e.g., silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent electrode layer formed over the reflective layer. In an implementation, the transparent electrode layer may include, e.g., indium tin oxide (ITO), indium zinc oxide (IZO), zinc oxide (ZnO), indium oxide ($In_2O_3$), indium gallium oxide (IGO), and/or aluminum zinc oxide (AZO).

The second electrode 232 may be, e.g., a transparent electrode. The second electrode 232 may include a metal thin film having a small work function, including Li, Ca, LiF/Ca, LiF/Al, Al, Ag, Mg, or a combination thereof. An auxiliary electrode layer or a bus electrode may include a material, e.g. ITO, IZO, ZnO, or $In_2O_3$, or the like, and may be further formed over the metal thin film. Accordingly, the second electrode 232 may transmit light emitted from an organic emission layer included in the intermediate layer 233. For example, the light emitted by the organic emission layer may be reflected directly or by the first electrode 231 formed as the reflective electrode and then discharged toward the second electrode 232.

In an implementation, the unit display 200 may be a bottom-emission type in which the light emitted by the organic emission layer is emitted toward the substrate 110. In this case, the first electrode 231 may be a transparent electrode, and the second electrode 232 may be a reflective electrode. In an implementation, the unit display 200 may be of a dual emission type that emits light in both directions of top and bottom surfaces of the unit display 200.

The second electrode 232 may have various shapes. For example, the second electrode 232 may be integrally formed over the entire surface of the substrate 110 or may be patterned to have an island shape and thus separately provided in each of the unit displays 200.

A pixel defining layer 219 may include an insulating material and may be formed over or on the first electrode 231. The pixel defining layer 219 may include an organic insulating material, e.g., polyimide, polyamide (PA), acryl resin, benzocyclobutene (BCB), and/or a phenolic resin, by using a method such as spin coating. The pixel defining layer 219 may expose a predetermined area of the first electrode 231. The intermediate layer 233 including the organic emission layer may be positioned in the exposed area of the first electrode 231. For example, the pixel defining layer 219 may define a pixel area of an organic light-emitting device.

The organic emission layer included in the intermediate layer 233 may include a low molecular organic material or a high molecular organic material. The intermediate layer 233 may selectively further include functional layers, such as a hole transport layer (HTL), an hole injection layer (HIL), an electron transport layer (ETL), an electron injection layer (EIL), or the like, in addition to the organic emission layer.

The encapsulation layer 300 encapsulating the unit display 200 may be formed over or on the second electrode 232. The encapsulation layer 300 may block external oxygen and moisture and may include a single layer or a plurality of layers.

The encapsulation layer 300 may include at least one of an organic encapsulation layer and an inorganic encapsulation layer.

In an implementation, the organic encapsulation layer may include, e.g., PMMA, PC, PS, acryl-based resin, epoxy-based resin, polyimide, polyethylene, or the like. In an implementation, the inorganic encapsulation layer may include, e.g., silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The encapsulation layer 300 may contact one of the first insulating layer 204 and the second insulating layer 206 (e.g., an inorganic layer exposed through or at the spaced area BA).

For example, when the second insulating layer 206 includes an inorganic material, the encapsulation layer 300 may contact the second insulating layer 206 in the spaced area BA. In an implementation, when the second insulating layer 206 includes an organic material and the first insulating layer 204 below the second insulating layer 206 includes an inorganic material, the second insulating layer 206 may be patterned to correspond to the spaced area BA to expose the first insulating layer 204. The exposed first insulating layer 204 may contact the encapsulation layer 300 in the spaced area BA.

Thus, the unit display 200 may be entirely surrounded by the encapsulation layer 300 and an inorganic layer in an encapsulation form, thereby effectively reducing or blocking penetration of moisture and/or oxygen, etc. from the outside.

In an implementation, the spaced area BA may surround each of the plurality of unit displays 200, and thus the plurality of unit displays 200 may be formed in an encapsulation form by the encapsulation layer 300 and the inorganic layer independently from each other and be isolated. For example, an organic layer that may be used as a diffusion path of moisture and/or oxygen, i.e., the planarization layer 209, may be cut off between or completely separated among the plurality of unit displays 200, thereby blocking moisture and/or oxygen penetrated into one of the unit displays 200 from being diffused to other neighboring unit display 200. Thus, in spite of penetration of external moisture and/or oxygen, a dark spot area may be minimized.

Figure 4:
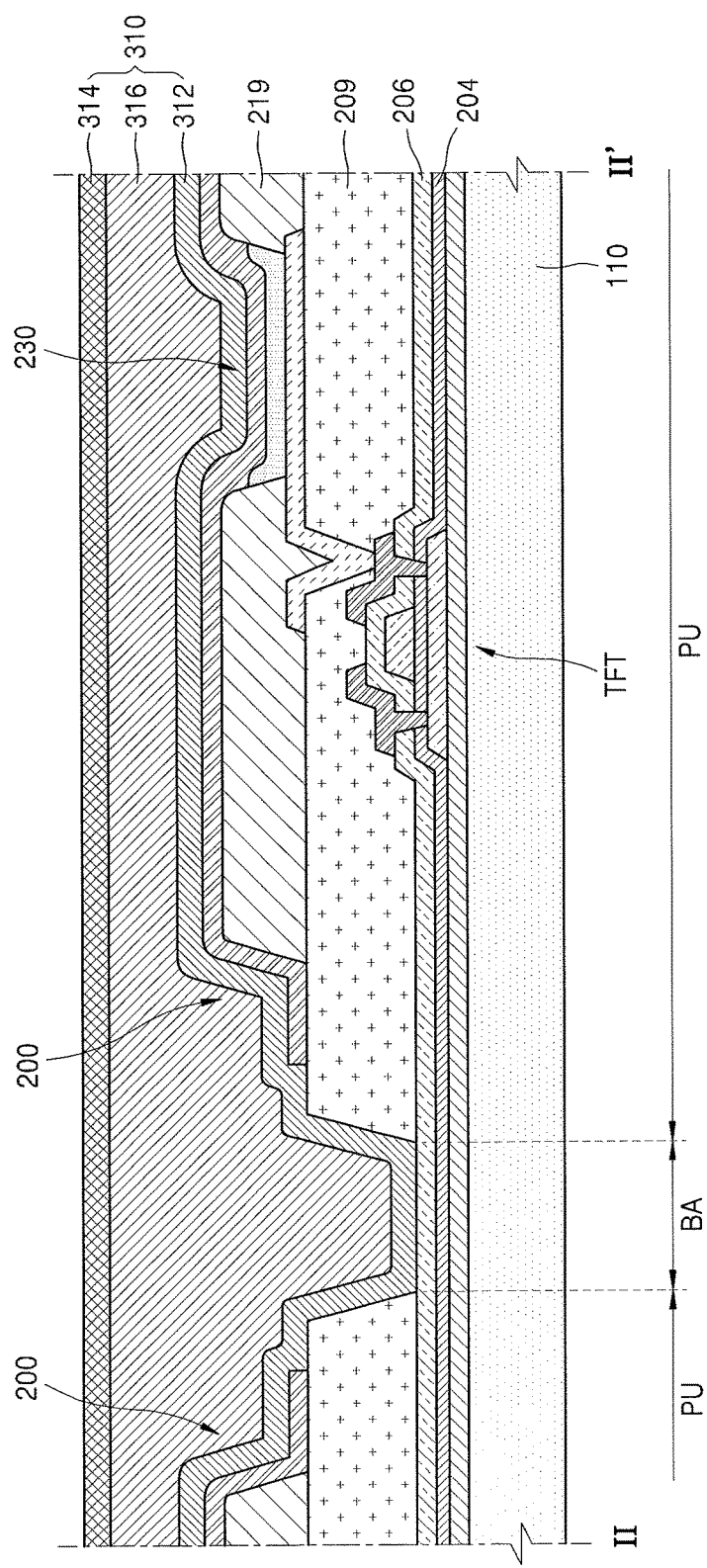
FIG. 4 illustrates a schematic cross-sectional view of an example of the display apparatus taken along line II-II' of FIG. 1.

FIG. 4 illustrates a schematic cross-sectional view of an example of the display apparatus 10 taken along line II-II' of FIG. 1.

Referring to FIG. 4, the plurality of unit displays 200 may be spaced apart from each other on the substrate 110. Each of the unit displays 200 may include the at least one organic light-emitting device 230 and the at least one thin film transistor TFT. The planarization layer 209 between the organic light-emitting device 230 and the thin film transistor TFT may include the unit planarization areas PU (respectively corresponding to the plurality of unit displays 200), and the spaced area BA may expose an inorganic layer positioned below (e.g., underlying) the planarization layer 209.

The spaced area BA may expose a surface of the inorganic layer positioned below the planarization layer 209. The inorganic layer exposed by the spaced area BA may be one of the first insulating layer 204 and the second insulating layer 206.

An encapsulation layer 310 may seal the plurality of unit displays 200. The encapsulation layer 310 may include, e.g., one or more inorganic encapsulation layers 312 and 314 (that are alternately stacked) and at least one organic encapsulation layer 316. For example, the organic encapsulation layer 316 may be between the inorganic encapsulation layers 312 and 314. An example of the encapsulation layer 310 including the two inorganic encapsulation layers 312 and 314 and the one organic encapsulation layer 316 is illustrated in FIG. 4. In an implementation, the encapsulation layer 310 may include a plurality of inorganic encapsulation layers and organic encapsulation layers that are alternately disposed.

In an implementation, the inorganic encapsulation layers 312 and 314 may include, e.g., silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The organic encapsulation layer 316 may help planarize steps cause by the pixel defining layer 219 and may help relax stress generated by the inorganic encapsulation layers 312 and 314. In an implementation, the organic encapsulation layer 316 may include, e.g., PMMA, PC, PS, acryl-based resin, epoxy-based resin, polyethylene, or the like.

In an implementation, the encapsulation layer 310 may have a structure in which the inorganic encapsulation layer 312, the organic encapsulation layer 316, and the inorganic encapsulation layer 316 are sequentially stacked from bottom to top. The lowermost inorganic encapsulation layer 312 (e.g., closest to the substrate 110) may contact an inorganic layer underlying the planarization layer 209 in or at the spaced area BA.

For example, when the second insulating layer 206 includes an inorganic material, the inorganic encapsulation layer 312 may contact the second insulating layer 206 in or at the spaced area BA. In an implementation, when the second insulating layer 206 includes an organic material and the first insulating layer 204 below the second insulating layer 206 includes an inorganic material, a surface of the first insulating layer 204 may be exposed at the spaced area BA, and the inorganic encapsulation layer 312 may contact the first insulating layer 204.

Thus, the unit display 200 may be individually formed in an encapsulation form by an inorganic layer such as the encapsulation layer 310 and the second insulating layer 206, etc., thereby blocking moisture and/or oxygen that may penetrate into one of the unit displays 200 from being diffused to other neighboring unit displays 200 through the planarization layer 209.

Figure 5:
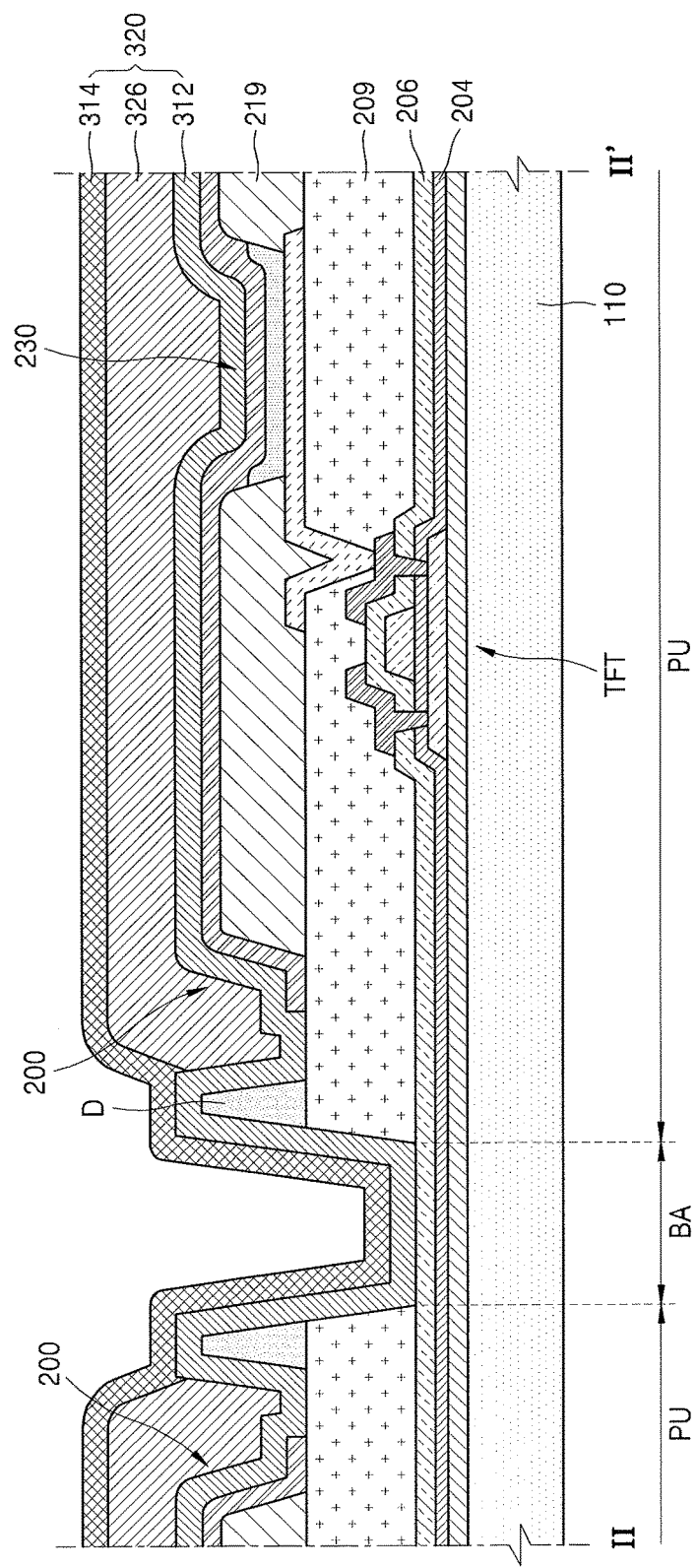
FIG. 5 illustrates a schematic cross-sectional view of another example of the display apparatus taken along line III-III' of FIG. 1.

FIG. 5 illustrates a schematic cross-sectional view of another example of the display apparatus 10 taken along line III-III' of FIG. 1.

Referring to FIG. 5, the plurality of unit displays 200 may be spaced apart from each other on the substrate 110. Each of the unit displays 200 may include the at least one organic light-emitting device 230 and the at least one thin film transistor TFT. The planarization layer 209 between the organic light-emitting device 230 and the thin film transistor TFT may include the unit planarization areas PU (respectively corresponding to the plurality of unit displays 200), and the spaced area BA may expose an inorganic layer positioned below or underlying the planarization layer 209.

The spaced area BA may expose a surface of the inorganic layer positioned below the planarization layer 209. The inorganic layer exposed by the spaced area BA may be one of the first insulating layer 204 and the second insulating layer 206.

An encapsulation layer 320 may seal the plurality of unit displays 200. The encapsulation layer 320 may include, e.g., the one or more inorganic encapsulation layers 312 and 314 that are alternately stacked and unit organic encapsulation layers 326 respectively corresponding to the plurality of unit displays 200.

The unit organic encapsulation layers 326 may be formed to respectively correspond to the plurality of unit displays 200 by patterning the organic encapsulation layer 316 of FIG. 4 or through screen printing, etc.

Thus, the first inorganic encapsulation layer 312 and the second inorganic encapsulation layer 314 (respectively disposed above and below the unit organic encapsulation layer 326, e.g., such that the unit organic encapsulation layer 326 is between the first inorganic encapsulation layer 312 and the second inorganic encapsulation layer 314, may contact each other at and/or beyond an edge of the unit organic encapsulation layer 326. Thus, a bonding force of the encapsulation layer 320 may be enhanced. The lowermost first inorganic encapsulation layer 312 may contact an inorganic layer exposed through the spaced area BA. In an implementation, the inorganic layer may be the first insulating layer 204 or the second insulating layer 206.

In an implementation, the unit display 200 may include a dam unit D surrounding the unit display 200 in or at an edge (e.g., outer edge) of the unit display 200. For example, the dam unit D may be disposed in an edge of the unit planarization area PU and may include a same material as the pixel defining layer 219. In an implementation, two or more dam units D may be provided. When a plurality of dam units D are provided, heights of the dam units D may increase toward the edge of the unit planarization area PU.

The dam unit D may help block an organic material or the like (e.g., for forming the unit organic encapsulation layer 326) from flowing in an edge direction of the unit planarization area PU, and may help limit a forming area of the unit organic encapsulation layer 326 when the unit organic encapsulation layer 326 is formed.

In an implementation, the first inorganic encapsulation layer 312 and the second inorganic encapsulation layer 314 may contact each other in or at an edge of the dam unit D. The first inorganic encapsulation layer 312 may contact an inorganic layer exposed through or at the spaced area BA.

Figure 6:
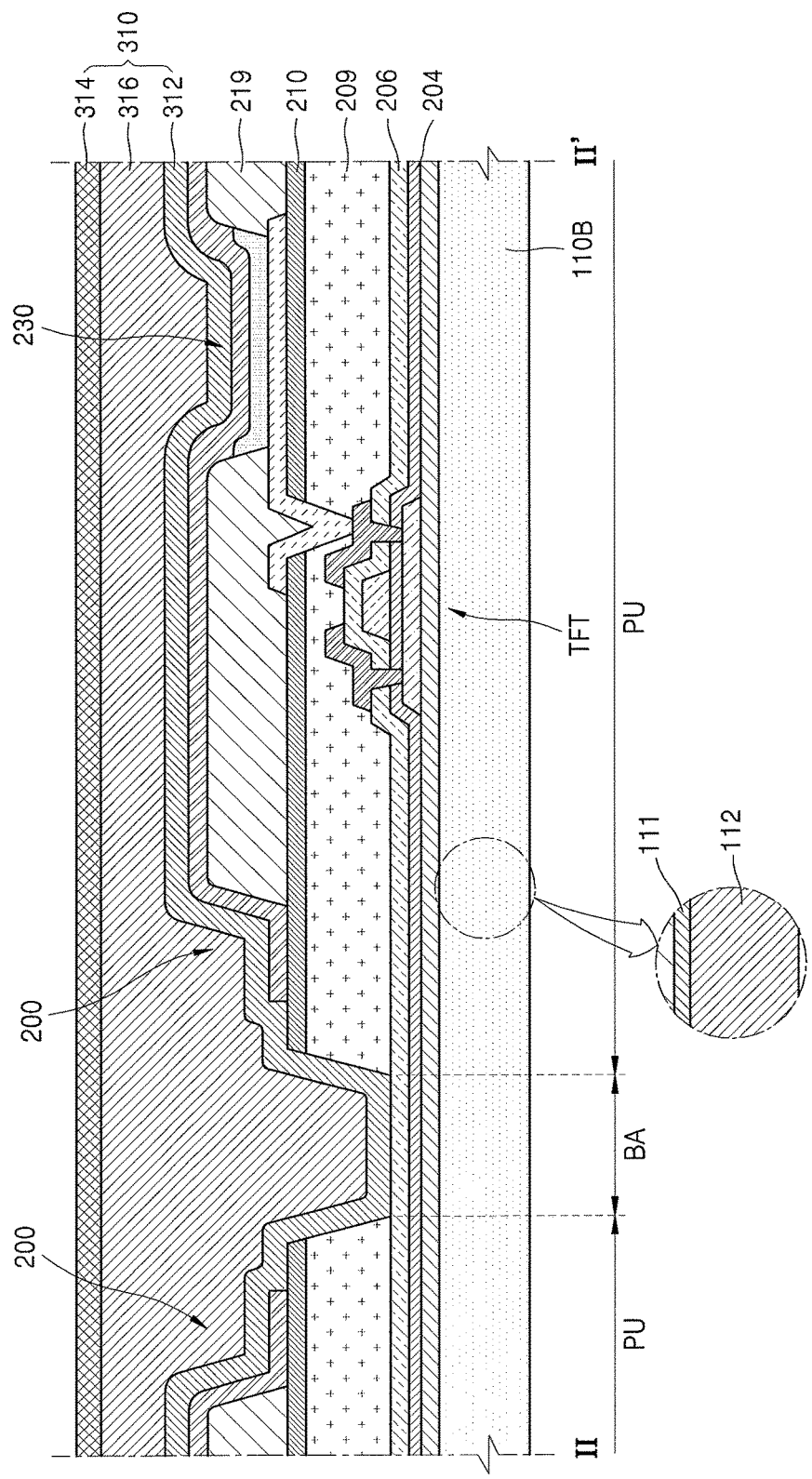
FIG. 6 illustrates a schematic cross-sectional view of another example of the display apparatus taken along line I-I' of FIG. 1.

FIG. 6 illustrates a schematic cross-sectional view of another example of the display apparatus 10 taken along line I-I' of FIG. 1.

Referring to FIG. 6, the plurality of unit displays 200 may be spaced apart from each other on a substrate 110B. Each of the unit displays 200 may include the at least one organic light-emitting device 230 and the at least one thin film transistor TFT. The planarization layer 209 between the organic light-emitting device 230 and the thin film transistor TFT may include the unit planarization areas PU (respectively corresponding to the plurality of unit displays 200), and the spaced area BA may expose an inorganic layer positioned below or underlying the planarization layer 209.

The spaced area BA may expose a surface of the inorganic layer positioned below the planarization layer 209. The inorganic layer exposed by the spaced area BA may be one of the first insulating layer 204 and the second insulating layer 206.

The encapsulation layer 310 may seal the plurality of unit displays 200. The encapsulation layer 310 may include, e.g., the one or more inorganic encapsulation layers 312 and 314 that are alternately stacked and the one or more organic encapsulation layers 316. The lowermost first inorganic encapsulation layer 312 may contact an inorganic layer exposed through the spaced area BA. In this regard, the inorganic layer may be the first insulating layer 204 or the second insulating layer 206.

A passivation layer 210 may be further formed over the planarization layer 209. The passivation layer 210 may be formed to correspond to the unit planarization areas PU of the planarization layer 209.

The passivation layer 210 may include an inorganic material. In an implementation, the passivation layer 210 may include the same material as the first inorganic encapsulation layer 312, e.g., silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The substrate 110B may have a stack structure of the first barrier layer 111 and the first support layer 112. For example, compared to the substrate 110 described with reference to FIG. 2, the substrate 110B may omit the second barrier layer 113 of FIG. 2 and the second support layer 114 of FIG. 2.

As the passivation layer 210 is further formed, the passivation layer 210, the planarization layer 209, and the first barrier layer 111 may perform the same functions as the first barrier layer 111 of FIG. 2, the first support layer 112 of FIG. 2, and the second barrier layer 113 of FIG. 2 of the substrate 110 of FIG. 2, even though the second barrier layer 113 of FIG. 2 and the second support layer 114 of FIG. 2 are omitted, and penetration of external moisture and/or oxygen into the organic light-emitting device 230 may be blocked.

Thus, a thickness of the display apparatus 10 of FIG. 1 may be further reduced, and efficiency of a manufacturing process may be enhanced. Meanwhile, the first support layer 112 may be used as a sacrificial layer like the second support layer 114 of FIG. 2 described with reference to FIG. 2.

Figure 7:
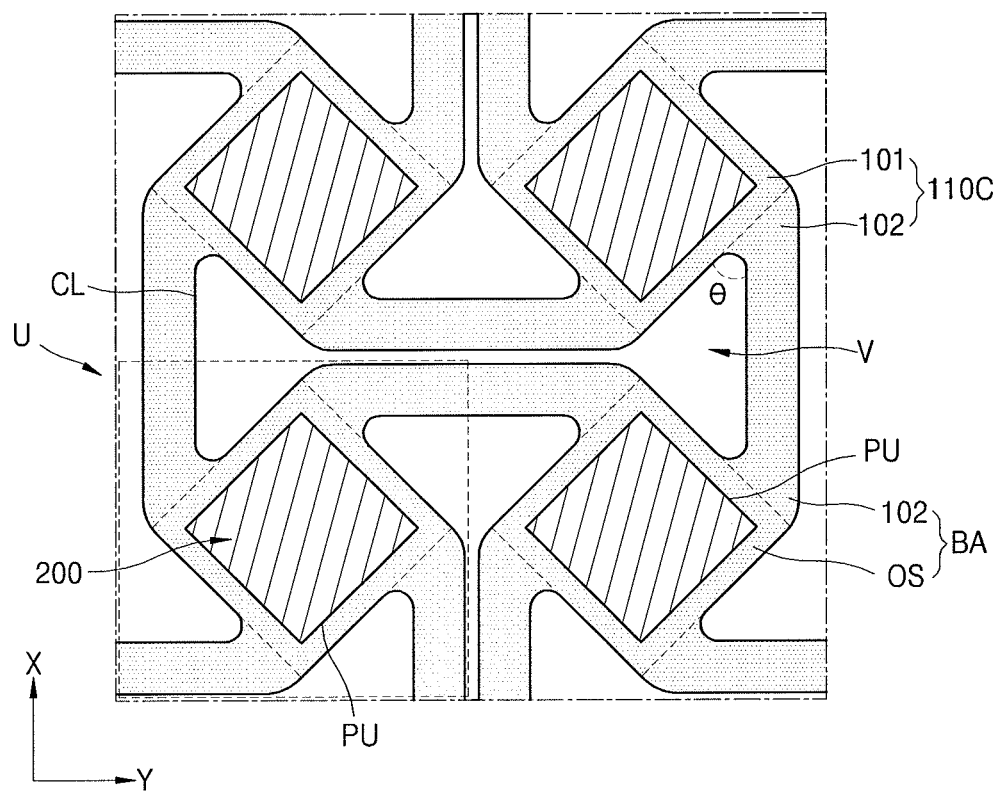
FIGS. 7 through 9 illustrate schematic magnified plan views of a portion A of FIG. 1.
Figure 8:
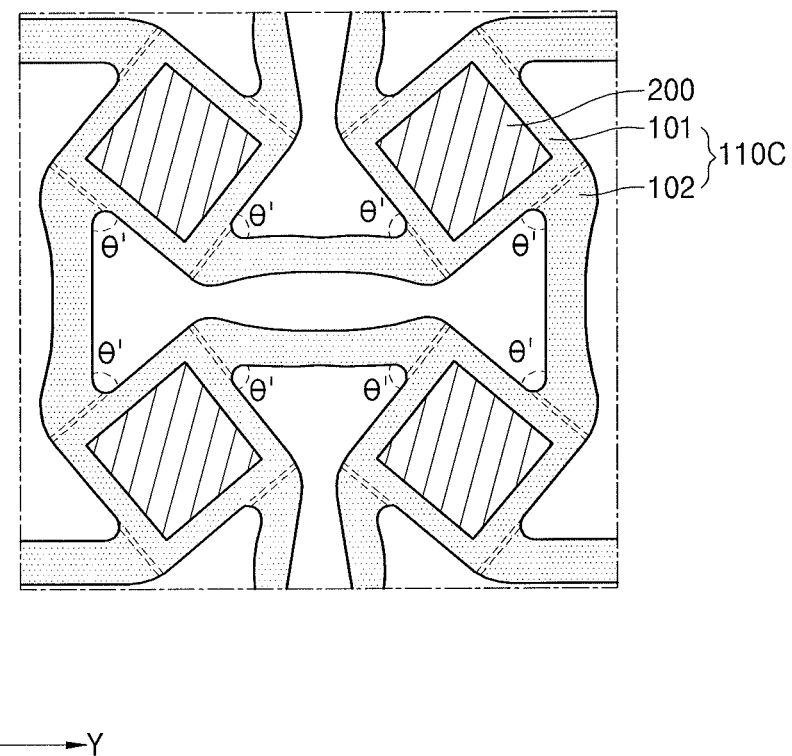
Figure 9:
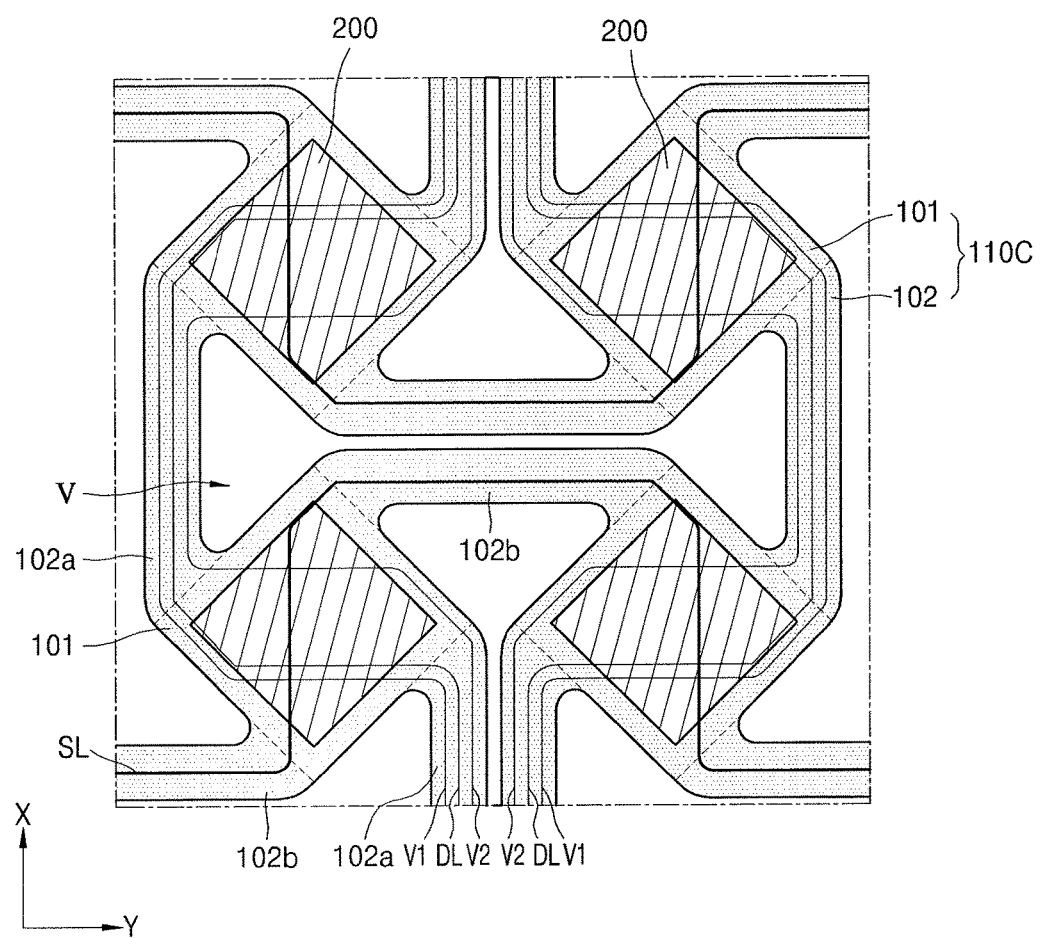

FIGS. 7 through 9 illustrate schematic magnified plan views of a portion A of FIG. 1.

Referring to FIGS. 7, 8, and 2, a substrate 110C may include a plurality of islands 101 spaced apart from each other, a plurality of connection units 102 connecting the plurality of islands 101, and a plurality of through holes V passing through the substrate 110C between the plurality of connection units 102.

The plurality of islands 101 may be arranged apart from each other. For example, the plurality of islands 101 may be repeatedly disposed in a first direction X and a second direction Y different from the first direction X to form a planar lattice pattern. For example, the first direction X and the second direction Y may meet at a right angle. In an implementation, the first direction X and the second direction Y may meet at obtuse or acute angles.

The plurality of connection units 102 may connect the plurality of islands 101 to each other. For example, the four connection units 102 may be connected to each of the plurality of islands 101 and may extend in different directions to be adjacent to the one island 101, and thus the four connection units 102 may be respectively connected to the other four islands 101 surrounding the one island 101. The plurality of islands 101 and the plurality of connection units 102 may include the same material and may be connected to each other. For example, the plurality of islands 101 and the plurality of connection units 102 may be integrally formed.

The through holes V may be formed to pass through the substrate 110C. The through holes V may provide spaced areas between the plurality of islands 101, may reduce the weight of the substrate 110C, and may help enhance the flexibility of the substrate 110C. When the substrate 110C is bent, folded, rolled, or the like, the shapes of the through holes V may change, thereby effectively reducing stress generated when the substrate 110C is deformed. Thus, abnormal deformation of the substrate 110C may be prevented, and durability of the substrate 110C may be enhanced.

The through holes V may be formed by removing one area of the substrate 110C via etching or the like. In an implementation, the through holes V may be provided when the substrate 110C is manufactured. In an implementation, the through holes V may be formed by forming the plurality of unit displays 200 over the substrate 110C and then patterning the substrate 110C. An example of a process of forming the through holes V in the substrate 110C may vary.

A unit U that is a basic unit forming the substrate 110C may be set and a structure of the substrate 110C will be described in more detail by using the unit U below.

The unit U may be repeatedly disposed in the first direction X and the second direction Y. For example, the substrate 110C may be understood as being formed by combining the plurality of units U repeatedly disposed in the first direction X and the second direction Y. The unit U may include the island 101 and the at least one connection unit 102 connected to the island 101. The four display units 102 may be connected to the one island 101.

The islands 101 of the two adjacent units U may be spaced apart from each other. The connection units 102 of the two adjacent units U may be connected to each other. In this regard, the connection unit 102 included in the unit U may be referred to as a partial area of the connection unit 102 located within an area of the unit U or may be referred to as the whole of the one connection unit 102 connecting the two islands 101 between the two adjacent islands 101.

The four adjacent units U among the plurality of units U may form a closed curve CL therebetween. The closed curve CL may define a spaced area V that is an empty space. The spaced area V may be formed by removing one area of the substrate 110C, may enhance the flexibility of the substrate 110C, and may help reduce stress generated when the substrate 110C is deformed. In an implementation, the connection unit 102 may have a smaller width than the island 101, so that the spaced area V may contact the islands 101 of the four units U.

The two adjacent units U among the plurality of units U may be symmetrical to each other. For example, as shown in FIG. 7, one unit U may be symmetrical to another unit U adjacent to the one unit U in the second direction Y in relation to a symmetrical axis parallel to the first direction X, and at the same time may be symmetrical to another unit U adjacent to the one unit U in the first direction X in relation to a symmetrical axis parallel to the second direction Y.

An angle θ formed by a direction in which the connection unit 102 extends and a side surface of the island 101 to which the connection unit 102 is connected may be an acute angle. For example, when the island 101 has a rectangular shape and rectangular corners are directed to the first direction X and the second direction Y, the connection units 102 may be connected to the island 101 at areas adjacent to the corners and may extend in a direction parallel to the second direction Y or the first direction X. For example, the connection unit 102 connected to the corners directed to the first direction X may be directed to the second direction Y or a $-2^{nd}$ direction −Y, and the connection unit 102 connected to the corners directed to the second direction Y may be directed to the first direction X or a $-1^{st}$ direction −X.

Thus, each of side surfaces of the two adjacent islands 101 connected to the one connection unit 102 and the direction in which the one connection unit 102 extends may form an acute angle, and accordingly the islands 101 may be densely arranged and an area of the spaced area V may be maximized by minimizing lengths of the connection units 102. The substrate 110C may be provided with an elongation property.

In an implementation, as shown in FIG. 8, when the substrate 110C elongates, all angles formed by the connection unit 102 and side surfaces of the island 101 to which the connection unit 102 is connected may increase (θ'>θ), so that an area of the spaced area V may increase, thereby increasing spaces between the islands 101, and thus the substrate 110C may elongate in the first direction X and the second direction Y.

Meanwhile, the connection unit 102 may have a smaller width than the island 101, and a shape change for the angle increase when an external force is applied to the substrate 110C may mainly occur in the connection unit 102, whereas the shape of the island 101 may not change even during elongation of the substrate 110C. Thus, the unit display 200 of the island 101 may be stably maintained even when the shape of the substrate 110C changes, and accordingly the substrate 110C may be easily applicable to a display device that require flexibility, e.g., a bending display device, a flexible display device, or a stretchable display device, or the like.

The unit displays 200 may be respectively disposed over or on the plurality of islands 101. Each of the plurality of unit displays 200 may include the thin film transistor TFT of FIG. 2 including one or more inorganic layers, the organic light-emitting device 230 of FIG. 2 electrically connected to the thin film transistor TFT of FIG. 2, and the planarization layer 209 of FIG. 2 disposed between the thin film transistor TFT of FIG. 2 and the organic light-emitting device 230 of FIG. 2.

The inorganic layers included in the thin film transistor TFT of FIG. 2 may be the first insulating layer 204 of FIG. 2 and the second insulating layer 206 of FIG. 2. The first insulating layer 204 of FIG. 2 and the second insulating layer 206 of FIG. 2 may be formed over the entire surface of the substrate 110C. For example, the first insulating layer 204 of FIG. 2 and the second insulating layer 206 of FIG. 2 may be formed on the plurality of islands 101 and the connection units 102.

The planarization layer 209 of FIG. 2 may include the unit planarization area PU respectively corresponding to the unit displays 200 and the spaced area BA exposing the first insulating layer 204 of FIG. 2 or the second insulating layer 206 of FIG. 2. The unit planarization area BA may be formed in an area of the island 101. Thus, the spaced area BA may include the connection unit 102 and an edge OS of the island 101.

An encapsulation layer may seal the plurality of unit displays 200. For example, the encapsulation layer may have the same shape as the substrate 110C. In an implementation, the encapsulation layer may be the encapsulation layer 300 described with reference to FIG. 2, the encapsulation layer 310 described with reference to FIG. 4, or the encapsulation layer 320 described with reference to FIG. 5.

The encapsulation layer may contact the exposed first insulating layer 204 of FIG. 2 or the second insulating layer 206 of FIG. 2 to form each of the plurality of unit displays 200 in an encapsulation form. For example, the encapsulation layer may contact the first insulating layer 204 of FIG. 2 or the second insulating layer 206 of FIG. 2 in the edge OS of the island 101 and the connection unit 102.

In an implementation, the encapsulation layer may contact the first insulating layer 204 of FIG. 2 or the second insulating layer 206 of FIG. 2 only in the edge OS of the island 101 and may not be formed over the connection unit 102. For example, the encapsulation layer may be disposed on each of the plurality of islands 101 and may split into a plurality of layers in order to independently seal each of the plurality of unit displays 200.

FIG. 9 illustrates an example wirings connected to the plurality of unit displays 200 when the plurality of unit displays 200 are respectively disposed over the islands 101. Referring to FIG. 9, one island 101 may be connected to a pair of first connection units 102a in an opposite side to the one island 101 and extending in a direction parallel to the first direction X and a pair of second connection units 102b disposed in an opposite side to the one island 101 and extending in a direction parallel to the second direction Y.

A first wiring unit may be positioned over the pair of first connection units 102a. A second wiring unit may be positioned over the pair of second connection units 102b. For example, the first wiring unit may include a first voltage line V1, a second voltage line V2, and at least one data line DL, and the second wiring unit may include at least one scan line SL.

The data line DL may be connected to the thin film transistor TFT of FIG. 0.2 and the drain electrode 208 of FIG. 2 to apply a data signal to the thin film transistor TFT. The first voltage line V1 may be included in each of the plurality of unit displays 200 to electrically connect the separated first electrodes 231 of FIG. 2 to each other. The scan line SL may be connected to the gate electrode 205 of FIG. 2 of the thin film transistor TFT of FIG. 2 to apply a scan signal to the thin film transistor TFT of FIG. 2.

In an implementation, each of the plurality of unit displays 200 may include the separated second electrodes 232 of FIG. 2. When the second electrodes 232 of FIG. 2 are separated from each other, the second voltage line V2 may have a pattern that is the same as or similar to that of the first voltage line V1 in order to electrically connect the separated second electrodes 232 of FIG. 2 to each other. In this regard, the second voltage line V2 may be electrically connected to the second electrode 232 of FIG. 2 through a contact hole.

The first wiring unit and the second wiring unit may cross each other over or on an island.

The first wiring unit may extend in the first direction X and may include a protruding and curved area in a direction parallel to the second direction Y around a through hole V. For example, the first wiring unit may extend in the first direction X and may repeat a curved shape at regular intervals, and brightness non-uniformity or the like between the unit displays 200 due to the first wiring unit may be reduced or prevented. A plurality of first wiring units extending in the same direction may be formed to not overlap with each other, thereby minimizing interference therebetween.

Similarly, the second wiring unit may extend in the second direction Y and may repeat a protruding and curved area in a direction parallel to the first direction X at regular intervals, and brightness non-uniformity or the like between the unit displays 200 due to the second wiring unit may be reduced or prevented. A plurality of second wiring units extending in the same direction may be formed to not overlap with each other, thereby minimizing interference therebetween.

By way of summation and review, a display device having slim profile and flexible characteristics may include a thin film encapsulation layer in order to block penetration of moisture or oxygen, etc. from the outside. If a defect (such as a small crack) were to occur in the thin film encapsulation layer, external moisture and/or oxygen could penetrate into a display device through the crack, which may cause a defect such as a dark spot, etc. The penetrated moisture and/or oxygen could diffuse in the display device through an organic layer of the display device, which may cause the dark spot to gradually grow.

The embodiments may provide a display device capable of reducing and/or preventing penetration of moisture and/or oxygen and blocking diffusion of the penetrated moisture and/or oxygen in a display device.

As described above, according to embodiments, a plurality of pixels may be independently sealed by inorganic layers disposed above and below, thereby effectively preventing moisture and/or oxygen from penetrating into the pixels from the outside.

An organic layer that may be used as a diffusion path of moisture and/or oxygen may be cut off between unit displays, thereby preventing moisture and/or oxygen that penetrate into one unit display from being diffused to another neighboring unit display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a substrate;
a plurality of unit displays disposed over the substrate, each of the unit displays including:
a thin film transistor including at least one inorganic layer,
a display device electrically connected to the thin film transistor, and
a planarization layer between the thin film transistor and the display device; and
an encapsulation layer encapsulating the plurality of unit displays,
wherein the planarization layer of each of the unit displays includes a spaced area exposing a surface of the at least one inorganic layer between the plurality of unit displays, and
wherein the encapsulation layer contacts the at least one inorganic layer in the spaced area, wherein:
the encapsulation layer includes unit organic encapsulation layers respectively corresponding to the plurality of unit displays, and a first inorganic encapsulation layer and a second inorganic encapsulation layer that contact each other at an edge of the unit organic encapsulation layers.

2. The display apparatus as claimed in claim 1, wherein the spaced area encloses each of the plurality of unit displays.

3. The display apparatus as claimed in claim 1, wherein:
the planarization layer of each of the unit displays includes unit planarization areas respectively corresponding to the plurality of unit displays, and
the unit planarization areas are spaced apart from each other by the spaced area.

4. The display apparatus as claimed in claim 1, wherein the planarization layer includes an organic material.

5. The display apparatus as claimed in claim 1, wherein the first inorganic encapsulation layer contacts the at least one inorganic layer in the spaced area.

6. The display apparatus as claimed in claim 1, wherein:
each of the plurality of unit displays includes a dam unit at an edge of each of the plurality of unit displays, and
the unit organic encapsulation layers are disposed inside the dam unit.

7. The display apparatus as claimed in claim 1, wherein:
the at least one inorganic layer includes a first insulating layer between an active layer of the thin film transistor and a gate electrode and a second insulating layer on the gate electrode, and
the first insulating layer or the second insulating layer is exposed in the spaced area.

8. The display apparatus as claimed in claim 1, wherein the display device includes:
a first electrode,
a second electrode, and
an intermediate layer between the first electrode and the second electrode, the intermediate layer including an organic emission layer.

9. A display apparatus, comprising:
a substrate;
a plurality of unit displays disposed over the substrate, each of the unit displays including:
a thin film transistor including at least one inorganic layer,
a display device electrically connected to the thin film transistor, and
a planarization layer between the thin film transistor and the display device; and
an encapsulation layer encapsulating the plurality of unit displays,
wherein the planarization layer of each of the unit displays includes a spaced area exposing a surface of the at least one inorganic layer between the plurality of unit displays,
wherein the encapsulation layer contacts the at least one inorganic layer in the spaced area, and wherein:
each of the plurality of unit displays further includes a passivation layer on the planarization layer, and
the substrate has a stack structure of a first barrier layer and a first support layer, the first barrier layer being closer to the thin film transistor than the first support layer.

10. The display apparatus as claimed in claim 9, wherein the passivation layer includes an inorganic material.

11. A display apparatus, comprising:
a substrate;
a plurality of unit displays disposed over the substrate, each of the unit displays including:
a thin film transistor including at least one inorganic layer,
a display device electrically connected to the thin film transistor, and
a planarization layer between the thin film transistor and the display device; and
an encapsulation layer encapsulating the plurality of unit displays,
wherein the planarization layer of each of the unit displays includes a spaced area exposing a surface of the at least one inorganic layer between the plurality of unit displays,
wherein the encapsulation layer contacts the at least one inorganic layer in the spaced area, and wherein:
the substrate includes:
a plurality of islands spaced apart from each other,
a plurality of connection units connecting the plurality of islands, and
a plurality of through units passing through the substrate between the plurality of connection units, and
the plurality of unit displays are respectively disposed over the plurality of islands.

12. The display apparatus as claimed in claim 11, wherein:
the spaced area includes the plurality of connection units and the plurality of islands, and
the encapsulation layer contacts the at least one inorganic layer at an edge of the plurality of islands.

13. The display apparatus as claimed in claim 12, wherein the encapsulation layer includes a plurality of encapsulation layers respectively disposed on the plurality of islands and independently sealing the plurality of unit displays.

14. The display apparatus as claimed in claim 11, wherein:
the plurality of islands are repeatedly disposed in a first direction and a second direction different from the first direction,
four connection units are respectively connected to the plurality of islands, and
the four connection units connected to one island of the plurality of islands extend in different directions and are respectively connected to other four islands that surround the one island.

15. The display apparatus as claimed in claim 14, wherein:
two adjacent ones of the plurality of islands are connected to one connection unit of the plurality of connection units, and
side surfaces of the two adjacent islands connected to the one connection unit and a direction in which the one connection unit extends meet at acute angles.

16. The display apparatus as claimed in claim 15, wherein:
each of the plurality of islands has a rectangular shape, and
corners of the rectangular shape are directed in the first direction and the second direction.

17. A display apparatus, comprising:
a substrate;
a plurality of unit displays on the substrate, each of the unit displays including:
a thin film transistor including at least one inorganic layer,
a display device electrically connected to the thin film transistor, and
a planarization layer between the thin film transistor and the display device; and
an encapsulation layer encapsulating the plurality of unit displays,
wherein the planarization layer of each of the unit displays is isolated from other planarization layers such that a spaced area is between the isolated planarization layers, the spaced area overlying a surface of the at least one inorganic layer,
wherein the encapsulation layer contacts the at least one inorganic layer in the spaced area, and wherein:
each of the plurality of unit displays includes a dam unit at an edge of each of the plurality of unit displays, and
organic encapsulation layers of the encapsulation layer are disposed inside the dam unit.

18. The display apparatus as claimed in claim 17, wherein:
   the encapsulation layer includes at least one inorganic encapsulation layer, and
   the at least one inorganic encapsulation layer contacts the at least one inorganic layer in the spaced area.

* * * * *